(12) United States Patent
Yin et al.

(10) Patent No.: US 9,277,425 B2
(45) Date of Patent: Mar. 1, 2016

(54) SYSTEMS AND METHODS FOR AUTOMATIC FREQUENCY CONTROL FOR MOBILE COMMUNICATION SYSTEMS

(71) Applicant: Marvell World Trade Ltd., St. Michael (BB)

(72) Inventors: Xiaojun Yin, Shanghai (CN); Shiyi Zhu, Shanghai (CN)

(73) Assignee: Marvell World Trade Ltd., St. Michael (BB)

( * ) Notice: Subject to any disclaimer, the term of this patent is extended or adjusted under 35 U.S.C. 154(b) by 429 days.

(21) Appl. No.: 13/783,568

(22) Filed: Mar. 4, 2013

(65) Prior Publication Data

US 2013/0260742 A1 Oct. 3, 2013

Related U.S. Application Data

(60) Provisional application No. 61/618,196, filed on Mar. 30, 2012.

(51) Int. Cl.
*H04M 1/00* (2006.01)
*H04W 24/02* (2009.01)
*H03J 7/04* (2006.01)
*H04W 88/06* (2009.01)

(52) U.S. Cl.
CPC ............... *H04W 24/02* (2013.01); *H03J 7/04* (2013.01); *H04W 88/06* (2013.01)

(58) Field of Classification Search
CPC .......... H04W 24/02; H04W 88/06; H03J 7/04
See application file for complete search history.

(56) References Cited

U.S. PATENT DOCUMENTS

| 5,982,831 A * | 11/1999 | Chu ................... H04J 3/0688 331/11 |
| 6,324,228 B1 * | 11/2001 | Millward et al. ............. 375/344 |
| 2009/0042591 A1 * | 2/2009 | Hong ..................... H03J 7/04 455/502 |
| 2009/0088085 A1 * | 4/2009 | Nilsson et al. .................. 455/76 |
| 2009/0225743 A1 * | 9/2009 | Nicholls ............... H04J 3/0688 370/350 |
| 2009/0258628 A1 * | 10/2009 | Lindoff ............... H04L 27/0014 455/302 |
| 2010/0330931 A1 * | 12/2010 | Uehara et al. .................. 455/75 |

* cited by examiner

*Primary Examiner* — Pakee Fang

(57) ABSTRACT

System and methods are provided for communicating with multiple wireless networks using a mobile communication system. An example mobile communication system includes a first communication device configured to communicate with a first wireless network and generate a reference signal for determining a first frequency deviation between the first communication device and the first wireless network, and a second communication device configured to communicate with a second wireless network and determine a second frequency deviation between the second communication device and the second wireless network based at least in part on the reference signal.

19 Claims, 9 Drawing Sheets

SYSTEMS AND METHODS FOR AUTOMATIC FREQUENCY CONTROL FOR MOBILE COMMUNICATION SYSTEMS

CROSS-REFERENCE TO RELATED APPLICATIONS

This disclosure claims priority to and benefit from U.S. Provisional Patent Application No. 61/618,196, filed on Mar. 30, 2012, the entirety of which is incorporated herein by reference.

FIELD

The technology described in this patent document relates generally to wireless communication and more particularly to mobile communication systems.

BACKGROUND

Wireless communication systems, such as cellular phones, can be used in many wireless networks implementing different technologies, e.g., Code Division Multiple Access (CDMA), Global System for Mobile Communications (GSM), General Packet Radio Service (GPRS), Evolution-Data Optimized (EV-DO), Enhanced Data Rates for GSM Evolution (EDGE), 3GSM, Digital Enhanced Cordless Telecommunications (DECT), Digital AMPS (IS-136/TDMA), and Integrated Digital Enhanced Network (iDEN), etc.

When a wireless communication system (e.g., a cellular phone) communicates with a base station of a wireless network, there is usually certain deviation between the receiving frequency of the wireless communication system and the transmitting frequency of the base station. Such frequency deviation usually comprises local oscillation frequency deviation and Doppler frequency shift. The local oscillation frequency deviation generally includes the difference between a local oscillation frequency of the wireless communication system and the transmitting frequency of the base station. Doppler frequency shift is often caused by the movement of the wireless communication system, and thus is associated with the speed and the direction at which the wireless communication system is moving relative to the base station.

SUMMARY

In accordance with the teachings described herein, systems and methods are provided for communicating with multiple wireless networks using a mobile communication system. An example mobile communication system includes a first communication device configured to communicate with a first wireless network and generate a reference signal for determining a first frequency deviation between the first communication device and the first wireless network, and a second communication device configured to communicate with a second wireless network and determine a second frequency deviation between the second communication device and the second wireless network based at least in part on the reference signal.

Further, a method is provided for communicating with multiple wireless networks using a mobile communication system. A first communication device in the mobile communication system communicates with a first wireless network. A reference signal is generated. A first frequency deviation between the first communication device and the first wireless network is determined. A second communication device in the mobile communication system communicates with a second wireless network. A second frequency deviation between the second communication device and the second wireless network is determined based at least in part on the reference signal.

DETAILED DESCRIPTION

When a wireless communication system (e.g., a cellular phone) communicates with a single wireless network, normal communication between the wireless communication system and the wireless network may be maintained when the frequency deviation between the receiving frequency of the wireless communication system and the transmitting frequency of a base station of the wireless network is controlled within a certain range. Thus, a wireless communication system often tracks and controls such frequency deviation between the wireless communication system and the wireless network. For example, the wireless communication system may include a crystal oscillator that generates a reference clock signal indicative of the receiving frequency of the wireless communication system. The frequency deviation between the wireless communication system and the wireless network may be determined by comparing the frequency of the reference clock signal with the transmitting frequency of a base station of the wireless network. The reference clock signal may then be adjusted in order to reduce the frequency deviation.

However, a wireless communication system (e.g., a cellular phone) may include multiple communication devices (e.g., chips) to communicate with multiple wireless networks respectively. The frequency deviations with respect to these wireless networks are often very different. For example, when the wireless communication system moves, the speeds and the directions at which the wireless communication system moves vary relative to the base stations of these wireless networks, and thus the Doppler shifts are different. Therefore, it can be hard to control the frequency deviations with respect to these wireless networks simultaneously by adjusting a single reference clock signal in response to each of these different frequency deviations. On the other hand, each communication device in the wireless communication system may have its own crystal oscillator and associated circuit components, so that multiple reference clock signals may be generated for the wireless networks respectively, but the system costs will increase.

Figure 1:
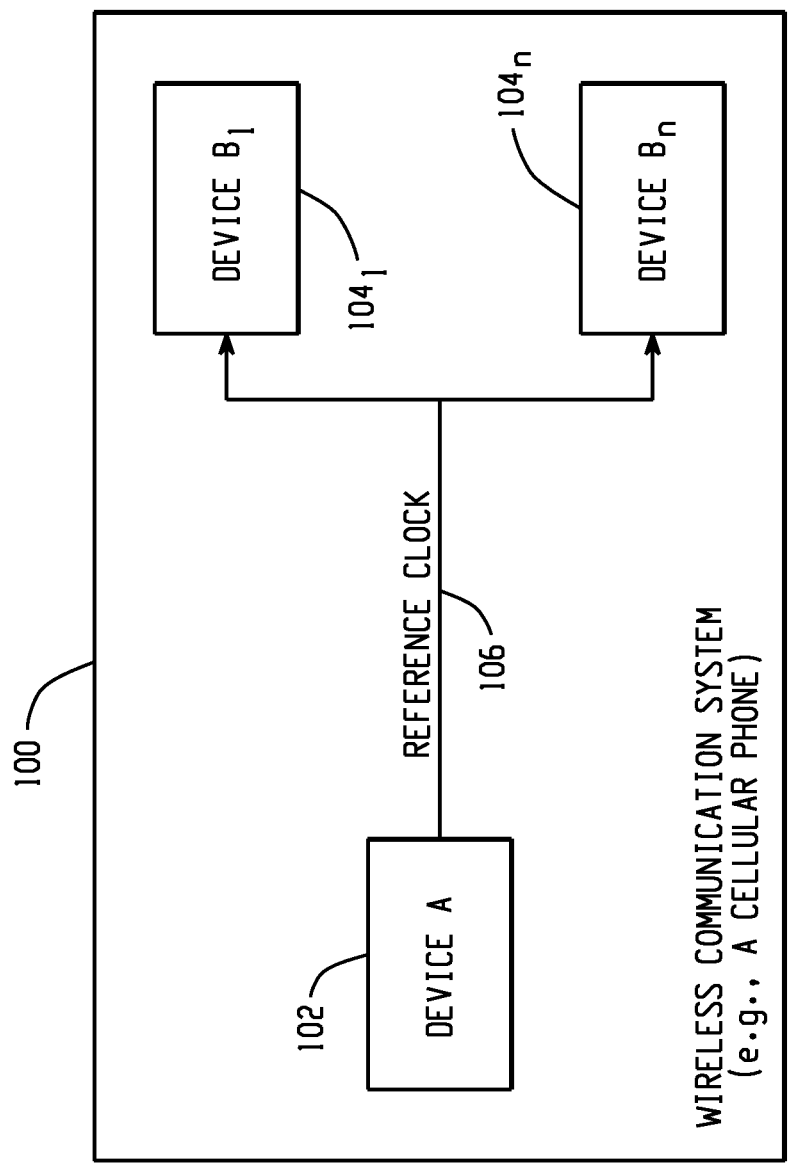
FIG. 1 illustrates an example wireless communication system communicating with multiple wireless networks.

FIG. 1 illustrates an example wireless communication system communicating with multiple wireless networks. The wireless communication system 100 (e.g., a single cellular phone) communicates with multiple wireless networks using communication devices 102, $104_1, \ldots,$ and $104_n$ (n is an integer) respectively, where the device 102 generates and controls a reference clock signal 106 which is shared with the devices $104_1, \ldots,$ and $104_n$. Specifically, the device 102 generates the reference clock signal 106 indicative of a receiving frequency of the device 102, and adjusts the reference clock signal 106 to keep a frequency deviation between the device 102 and a wireless network with which the device 102 communicates within a predetermined range. Furthermore, one of the devices $104_1, \ldots,$ and $104_n$ determines a frequency deviation with respect to another wireless network with which the device communicates based at least in part on the reference clock signal 106. Then, the device (e.g., $104_1, \ldots,$ or $104_n$) operates to keep the frequency deviation within a predetermined range without changing the reference clock signal 106. For example, the device (e.g., $104_1, \ldots,$ or $104_n$) may adjust the receiving (or transmitting) frequency through internal mechanisms.

Figure 2:
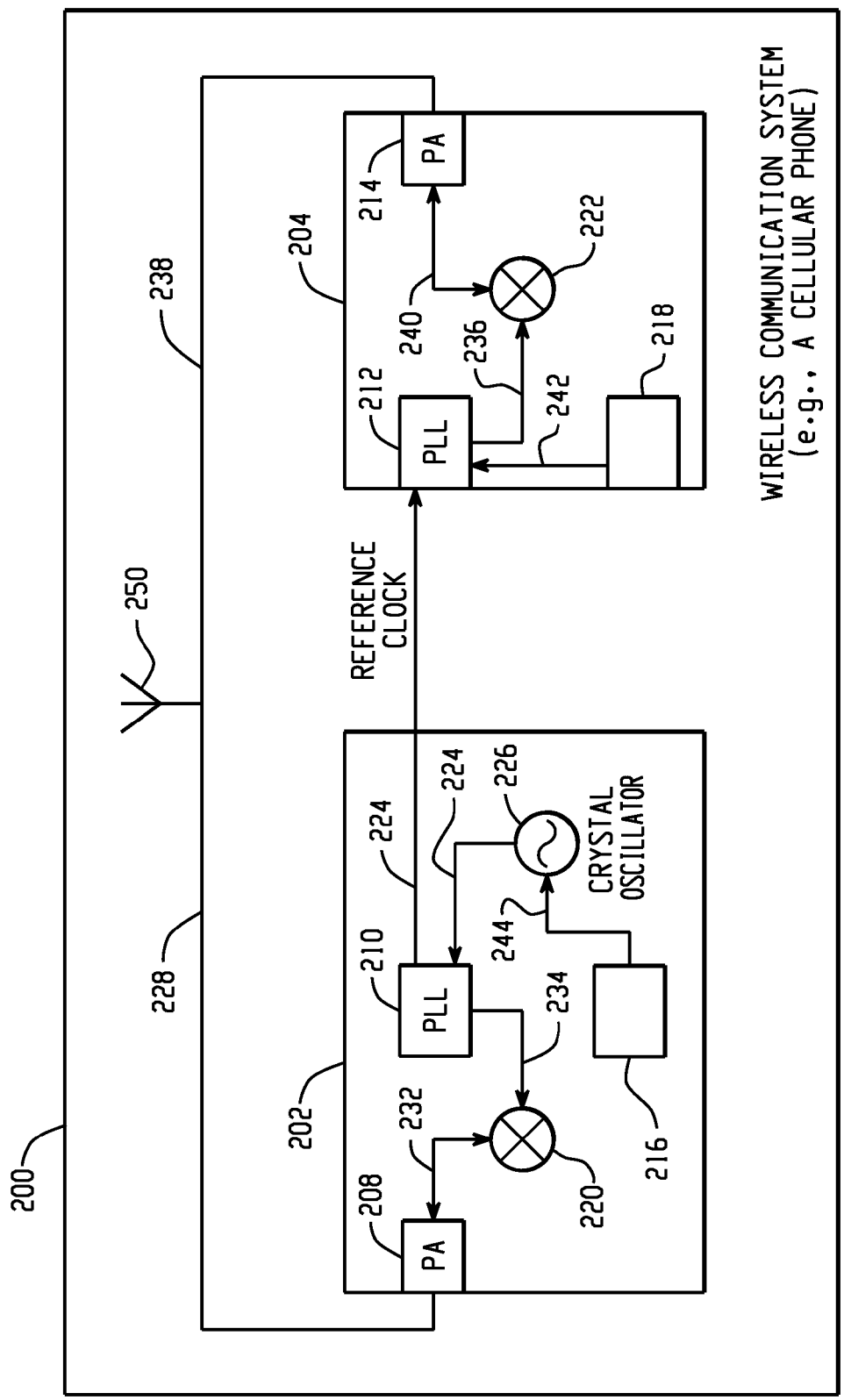
FIG. 2 illustrates an example wireless communication system communicating with two wireless networks.

FIG. 2 illustrates an example wireless communication system 200 (e.g., a single cellular phone) that includes two communication devices 202 and 204 for communicating (e.g., receiving/transmitting signals) with two wireless networks α and β respectively through one or more antennas 250. The communication devices 202 and 204 depicted in FIG. 2 may, for example, be the device 102 and one of the devices $104_1, \ldots,$ and $104_n$ respectively.

As shown in FIG. 2, the device 202 generates a reference clock signal 224 using a reference-signal generator 226 (e.g., a crystal oscillator), and adjusts the reference clock signal 224 to keep a frequency deviation between the device 202 and the wireless network α with which the device 202 communicates within a predetermined range. The device 204 receives the reference clock signal 224 and determines a frequency deviation between the device 204 and the wireless network β based at least in part on the reference clock signal 224. Then, the device 204 operates to keep the frequency deviation within a predetermined range.

Specifically, when the device 202 attempts to access and communicate with the wireless network α through the antennas 250, the device 202 uses an initial receiving frequency. If the deviation between the initial receiving frequency and the transmitting frequency of a base station of the wireless network α is within a certain range (e.g., 1 parts per million), the device 202 can achieve synchronization and access to the wireless network α. As long as the frequency deviation is kept within the range, the device 202 can continue to receive signals from the base station.

In operation, a power amplifier 208 in the device 202 receives a signal 228 from the wireless network α through the antennas 250 and outputs an amplified signal 232 to a multiplexer 220. The reference-signal generator 226 outputs the reference clock signal 224 (e.g., 26 MHz) to a phase-locked loop 210 which outputs a signal 234 indicative of the initial receiving frequency (e.g., about 2.6 GHz) to the multiplexer 220. For example, the phase of the signal 234 is related to the reference clock signal 224. A frequency deviation between the device 202 and the wireless network α may be determined based on the amplified signal 232 and the signal 234. A signal-processing component 216 (e.g., a digital-to-analog converter) outputs a signal 244 to the reference-signal generator 226 to adjust the reference clock signal 224 in order to keep the frequency deviation between the device 202 and the wireless network α within the predetermined range.

The phase-locked loop 210 outputs the reference clock signal 224 to a phase-locked loop 212 in the device 204 which outputs a signal 236 indicative of a receiving frequency of the device 204 to a multiplexer 222. When the receiving frequency of the device 204 is within a predetermined range of the transmitting frequency of a base station of the wireless network β, a power amplifier 214 in the device 204 receives a signal 238 from the wireless network β through the antennas 250 and outputs an amplified signal 240 to the multiplexer 222. A frequency deviation between the device 204 and the wireless network β is determined based on the amplified signal 240 and the signal 236. A signal-processing component 218 (e.g., a register) stores the determined frequency deviation and generates a signal 242 to affect the output of the phase-locked loop 212 so as to keep the frequency deviation between the device 204 and the wireless network β within the predetermined range. For example, the antennas 250 may include two antennas for the devices 202 and 204 respectively.

Figure 3:
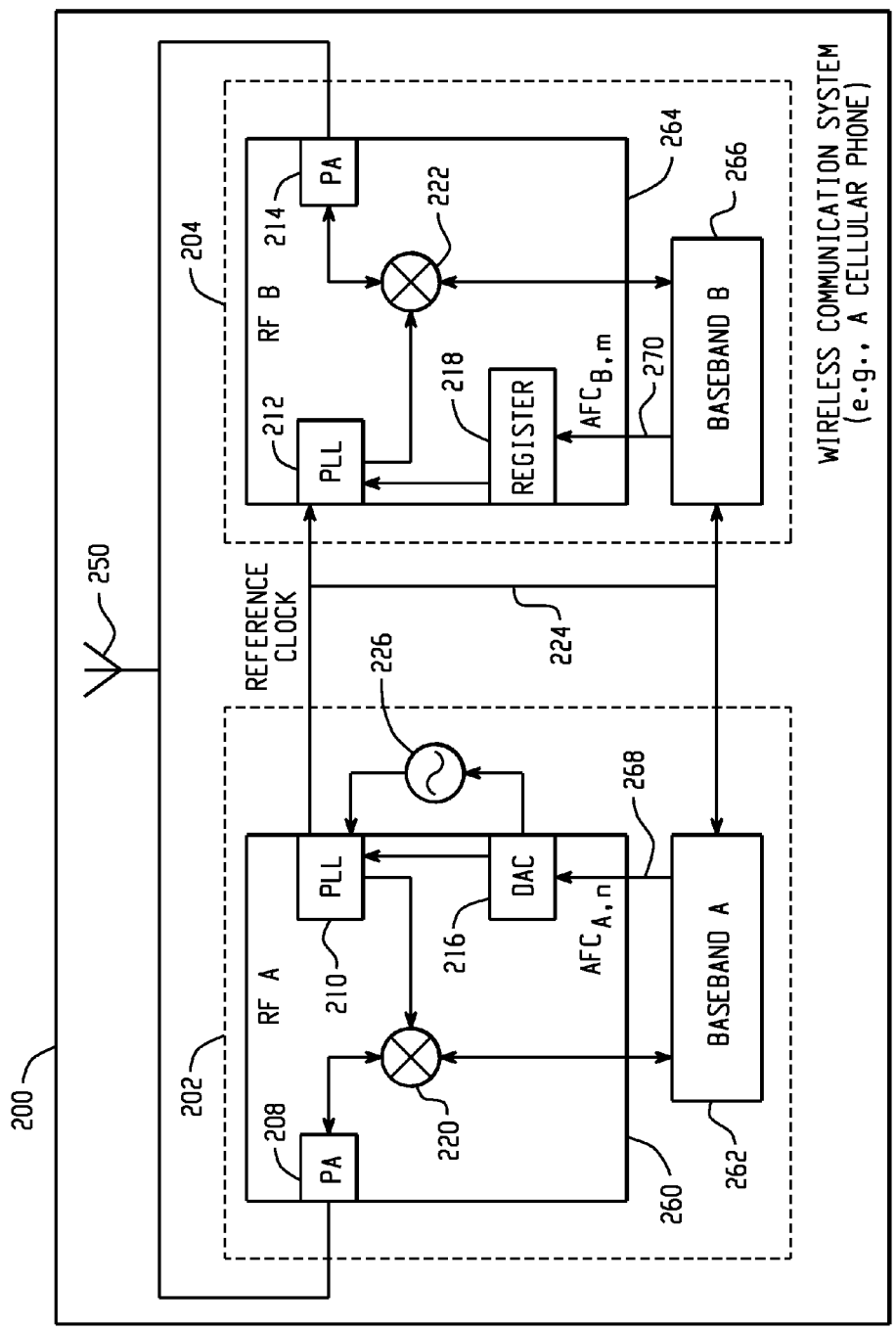
FIG. 3 illustrates an example of some components in the wireless communication system as shown in FIG. 2.

In one embodiment, the communication devices 202 and 204 may each include a radio-frequency (RF) communication component for communicating with a wireless network and a baseband component for determining a frequency deviation. As shown in FIG. 3, the device 202 includes a RF communication component 260 and a baseband component 262, and the device 204 includes a RF communication component 264 and a baseband component 266.

In operation, the baseband component 262 outputs a signal 268 indicative of a frequency deviation (e.g., $\text{AFC}_{A,\,n}$) between the device 202 and the wireless network α to the signal-processing component 216 (e.g., a digital-to-analog converter) which may affect the reference-signal generator 226 to control the frequency deviation (e.g., $\text{AFC}_{A,\,n}$) for the device 202. In addition, the baseband component 266 outputs a signal 270 indicative of a frequency deviation (e.g., $\text{AFC}_{B,\,m}$) between the device 204 and the wireless network β to the signal-processing component 218 (e.g., a register) which may affect the phase-locked loop 212 to control the frequency deviation (e.g., $\text{AFC}_{B,\,m}$) for the device 204.

Figure 4:
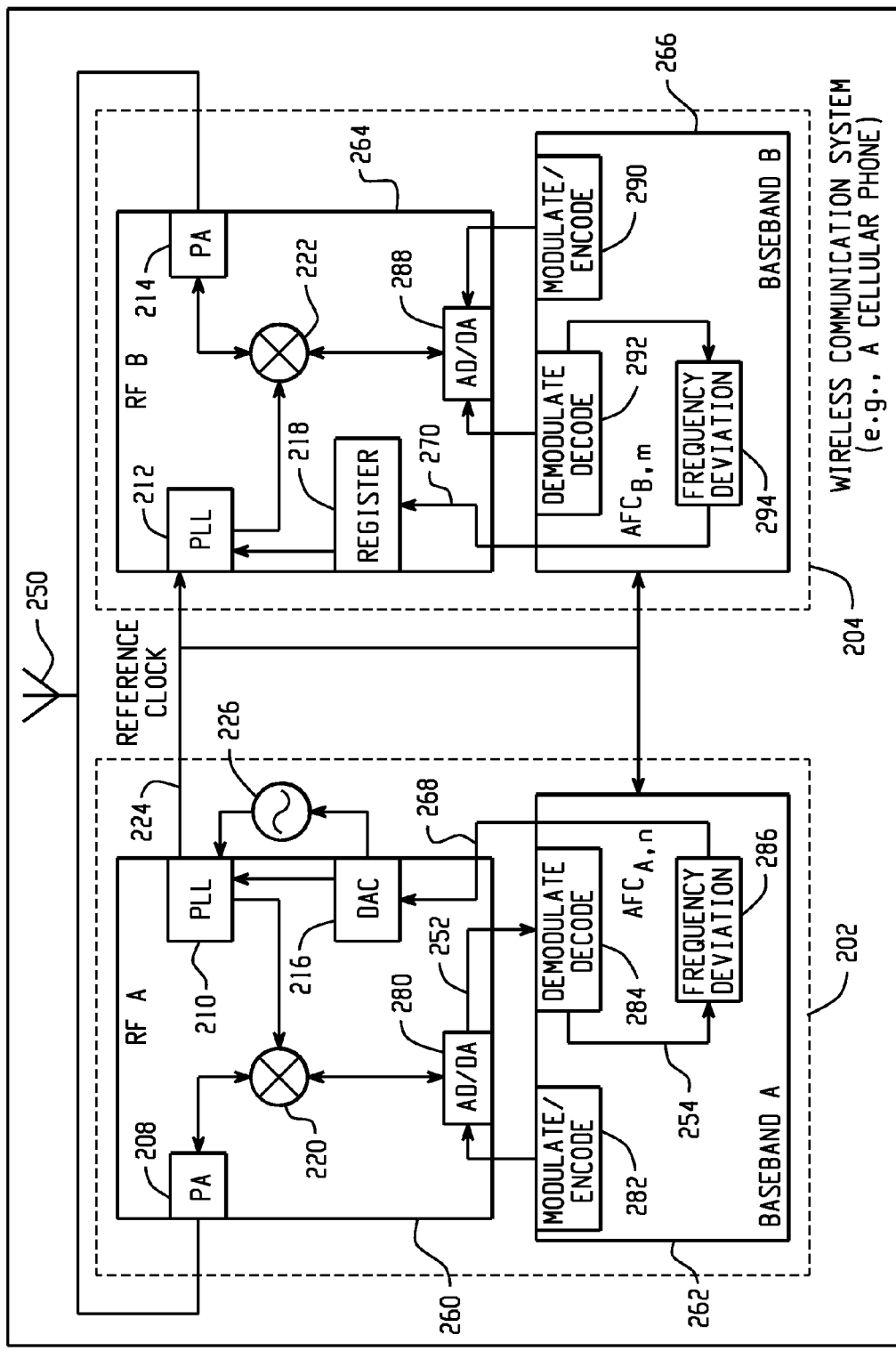
FIG. 4 illustrates an example of certain components in the wireless communication system as shown in FIG. 3.

FIG. 4 illustrates an example of certain components in the wireless communication system 200. As shown in FIG. 4, the RF communication component 260 further includes an analog-to-digital/digital-to-analog (AD/DA) converter 280, and the baseband component 262 includes a modulator/encoder 282, a demodulator/decoder 284 and a frequency-deviation estimator 286. When the device 202 operates in a reception mode, the AD/DA converter 280 may output a processed signal 252 to the demodulator/decoder 284 which generates a demodulated signal 254 for the frequency-deviation estimator 286 to determine a frequency deviation for the device 202. For example, the frequency-deviation estimator 286 may use a look-up table to generate a voltage value based on a residual frequency-deviation value. The signal-processing component 216 may receive the signal 268 representative of the generated voltage value for controlling the reference-signal generator 226 to keep the frequency deviation within the predetermined range. In addition, the AD/DA converter 280 may process modulated/encoded signals generated from the modulator/encoder 282 for transmission by the device 202.

Moreover, the RF communication component 264 further includes an AD/DA converter 288. The baseband component 266 includes a modulator/encoder 290, a demodulator/decoder 292 and a frequency-deviation estimator 294 to perform similar operations as the baseband component 262. For example, the baseband components 262 and 266 may be built on a same baseband chip. In one embodiment, the RF communication components 260 and 264 may share a same frequency-deviation estimator, a same AD/DA converter, a same encoder/modulator, and/or a same demodulator/decoder.

Figure 5:
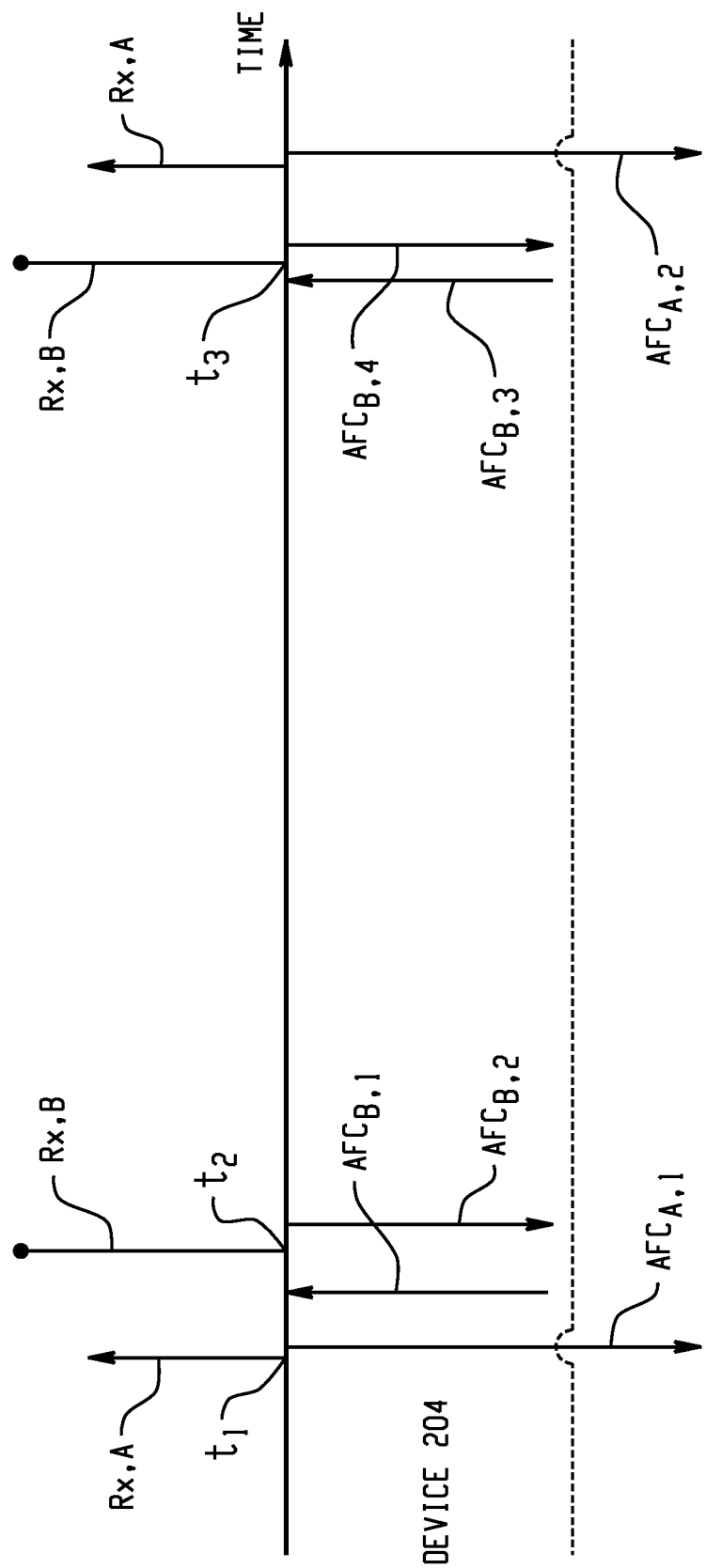
FIG. 5 shows a timing diagram illustrating an example operation of the wireless communication system as shown in FIGS. 2-4.

FIG. 5 shows a timing diagram illustrating an example operation of the wireless communication system 200. As shown in FIG. 5, the device 202 adjusts the reference clock signal 224 after receiving a signal from the wireless network α. The device 204 determines a frequency deviation with respect to the wireless network β based at least in part on the reference clock signal 224.

Specifically, after a first reception from the wireless network α (e.g., $R_{x,A}$ at $t_1$), the device 202 determines a frequency deviation $AFC_{A,1}$, and adjusts the reference clock signal 224 so as to control the frequency deviation as described above with respect to FIGS. 2-4. In preparation for communication with the wireless network β, the device 204 determines a frequency deviation $AFC_{B,1}$ with respect to the wireless network β based at least in part on the reference clock signal 224. The phase-locked loop 212 may be adjusted based on the determined frequency deviation $AFC_{B,1}$. After a first reception from the wireless network β (e.g., $R_{x,B}$ at $t_2$), the device 204 determines another frequency deviation $AFC_{B,2}$ based on the received signal and the reference clock signal 224 and stores the determined frequency deviation $AFC_{B,2}$ in the signal-processing component 218 (e.g., a register).

In preparation for a second reception (e.g., $R_{x,B}$ at $t_3$), the device 204 needs to determine a frequency deviation (e.g., $AFC_{B,3}$) with respect to the wireless network β. As shown in FIG. 5, the device 202 does not receive signals from the wireless network α between the times $t_2$ and $t_3$, and thus the reference clock signal 224 is not changed during that time period. Therefore, the frequency deviation $AFC_{B,3}$ is the same as the frequency deviation $AFC_{B,2}$. After the second reception, the device 204 determines another frequency deviation $AFC_{B,4}$ based on the received signal and the reference clock signal 224 and stores the determined frequency deviation $AFC_{B,4}$ in the signal-processing component 218 (e.g., a register).

Figure 6:
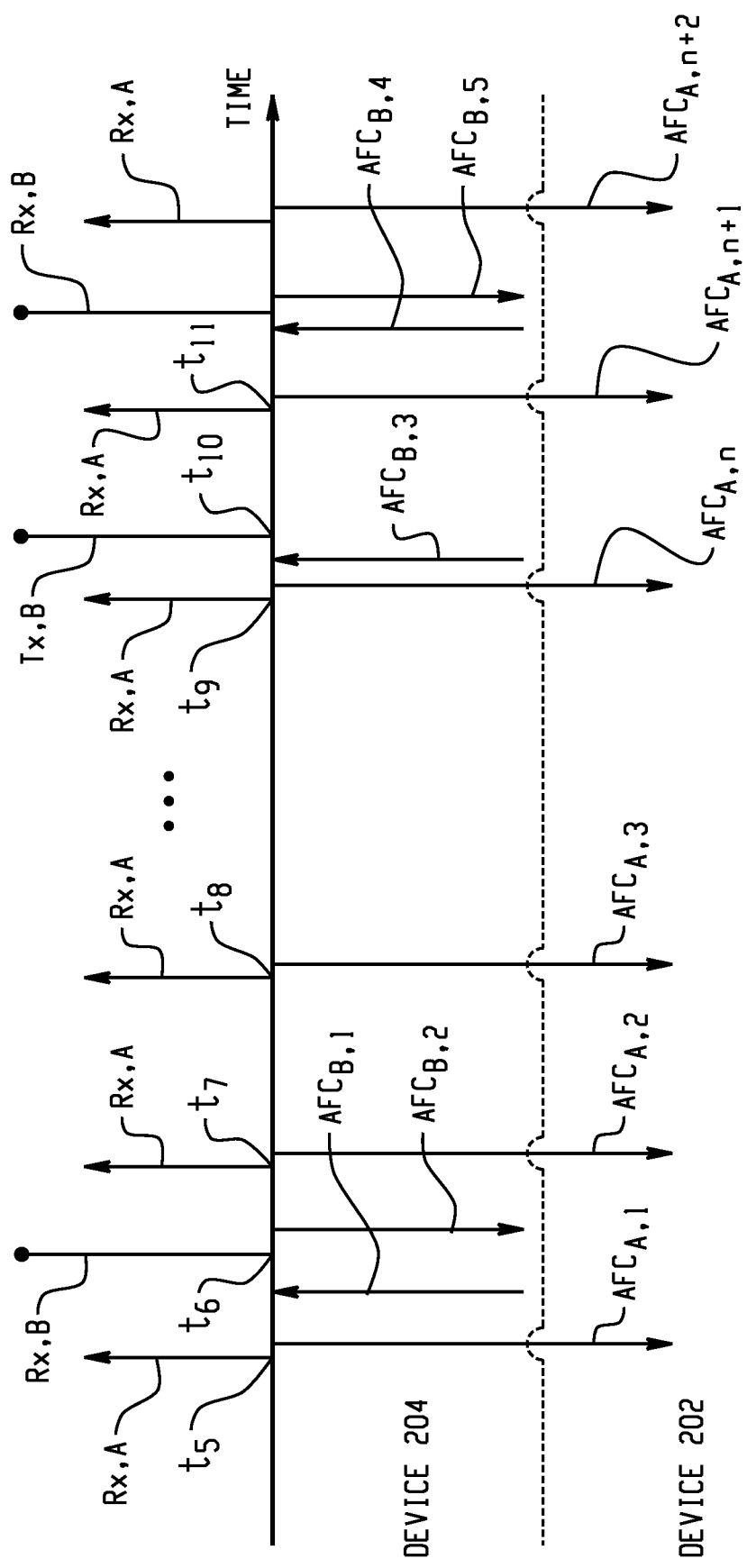
FIG. 6 shows a timing diagram illustrating another example operation of the wireless communication system as shown in FIGS. 2-4.

FIG. 6 shows a timing diagram illustrating another example operation of the wireless communication system 200. As shown in FIG. 6, the device 202 adjusts the reference clock signal 224 after each reception from the wireless network α. When the device 204 determines a frequency deviation for communication with the wireless network β, it takes into account preceding changes to the reference clock signal 224 made by the device 202.

Specifically, after a first reception from the wireless network α (e.g., $R_{x,A}$ at $t_5$), the device 202 determines a frequency deviation $AFC_{A,1}$, and adjusts the reference clock signal 224. In preparation for communication with the wireless network β, the device 204 determines a frequency deviation $AFC_{B,1}$ with respect to the wireless network β based at least in part on the reference clock signal 224. The phase-locked loop 212 may be adjusted based on the determined frequency deviation $AFC_{B,1}$. After a first reception from the wireless network β (e.g., $R_{x,B}$ at $t_6$), the device 204 determines another frequency deviation $AFC_{B,2}$ based on the received signal and the reference clock signal 224 and stores the determined frequency deviation $AFC_{B,2}$ in the signal-processing component 218 (e.g., a register).

Thereafter, the device 202 has multiple receptions from the wireless network α (e.g., $R_{x,A}$ at $t_7$, $R_{x,A}$ at $t_8$, ..., $R_{x,A}$ at $t_9$), and further adjusts the reference clock signal 224 after each reception based on determined frequency deviations (e.g., $AFC_{A,2}, AFC_{A,3}, \ldots, AFC_{A,n}$). In preparation for a transmission, the device 204 needs to determine a frequency deviation with respect to the wireless network β. The frequency deviation $AFC_{B,2}$ stored in the signal-processing component 218 was determined based on the reference clock signal 224 right after the first reception of the device 202, without taking into account the changes made by the device 202 subsequently. Thus, the device 204 determines a new frequency deviation with respect to the wireless network β as follows:

$$AFC_{B,3} = AFC_{B,2} - (AFC_{A,n} - AFC_{A,1}) \quad (1)$$

Then, the device 204 completes a transmission (e.g., $T_{x,B}$ at $t_{10}$) based on the newly determined frequency deviation $AFC_{B,3}$.

Subsequently, after another reception from the wireless network α (e.g., $R_{x,A}$ at $t_{11}$), the device 202 determines a frequency deviation $AFC_{A,n+1}$, and adjusts the reference clock signal 224 accordingly. For future communication with the wireless network β, the device 204 determines a frequency deviation $AFC_{B,4}$ with respect to the wireless network β as follows to be stored in the signal-processing component 218:

$$AFC_{B,4} = AFC_{B,3} - (AFC_{A,n+1} - AFC_{A,n}) \quad (2)$$

Figure 7:
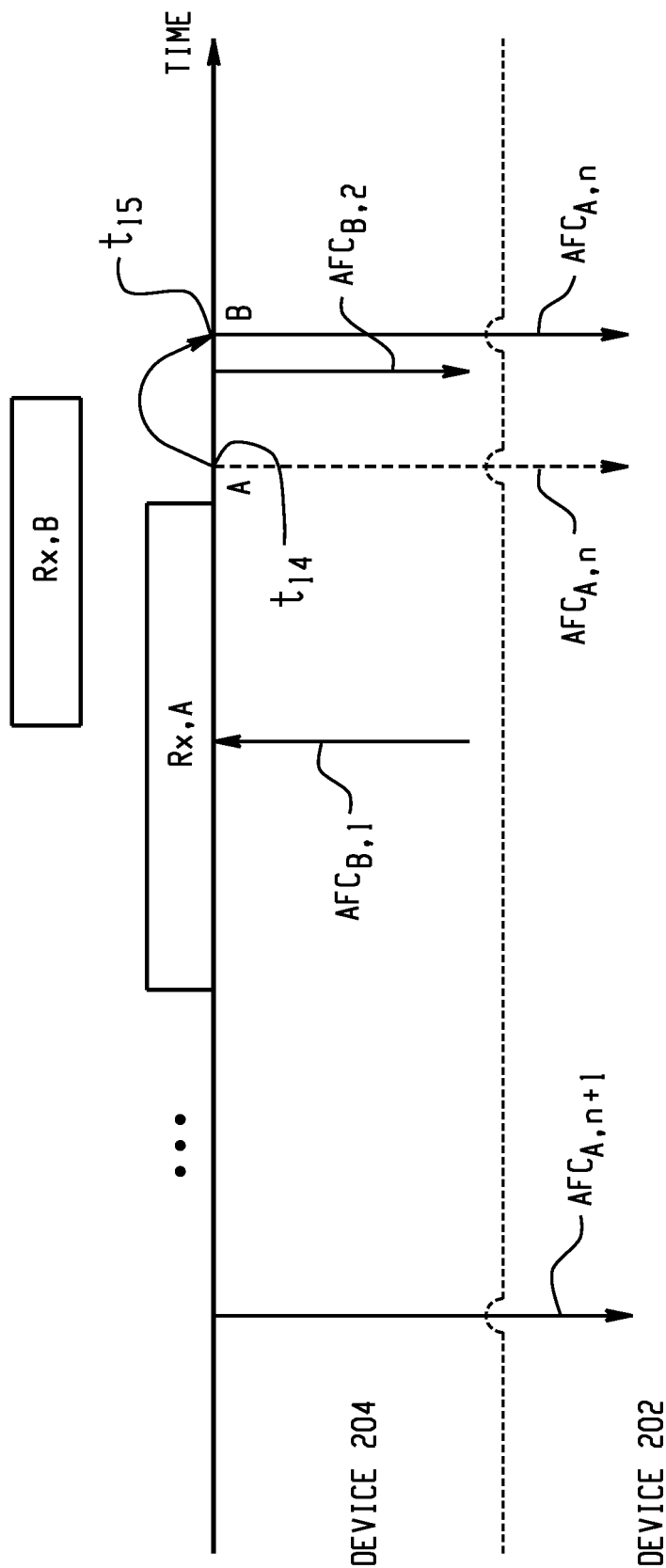
FIGS. 7-9 show timing diagrams illustrating example operations of the wireless communication system as shown in FIGS. 2-4 for timing control of adjusting the reference clock signal.
Figure 8:
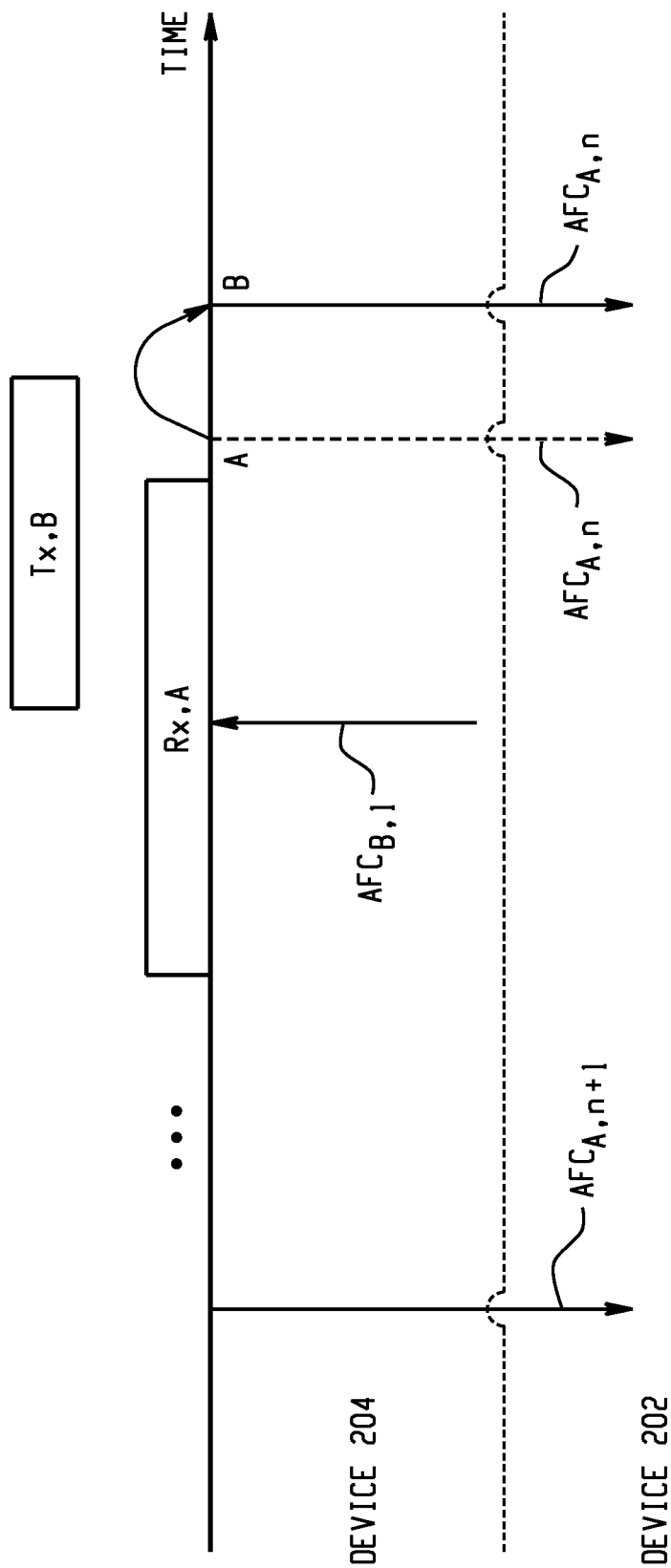
Figure 9:
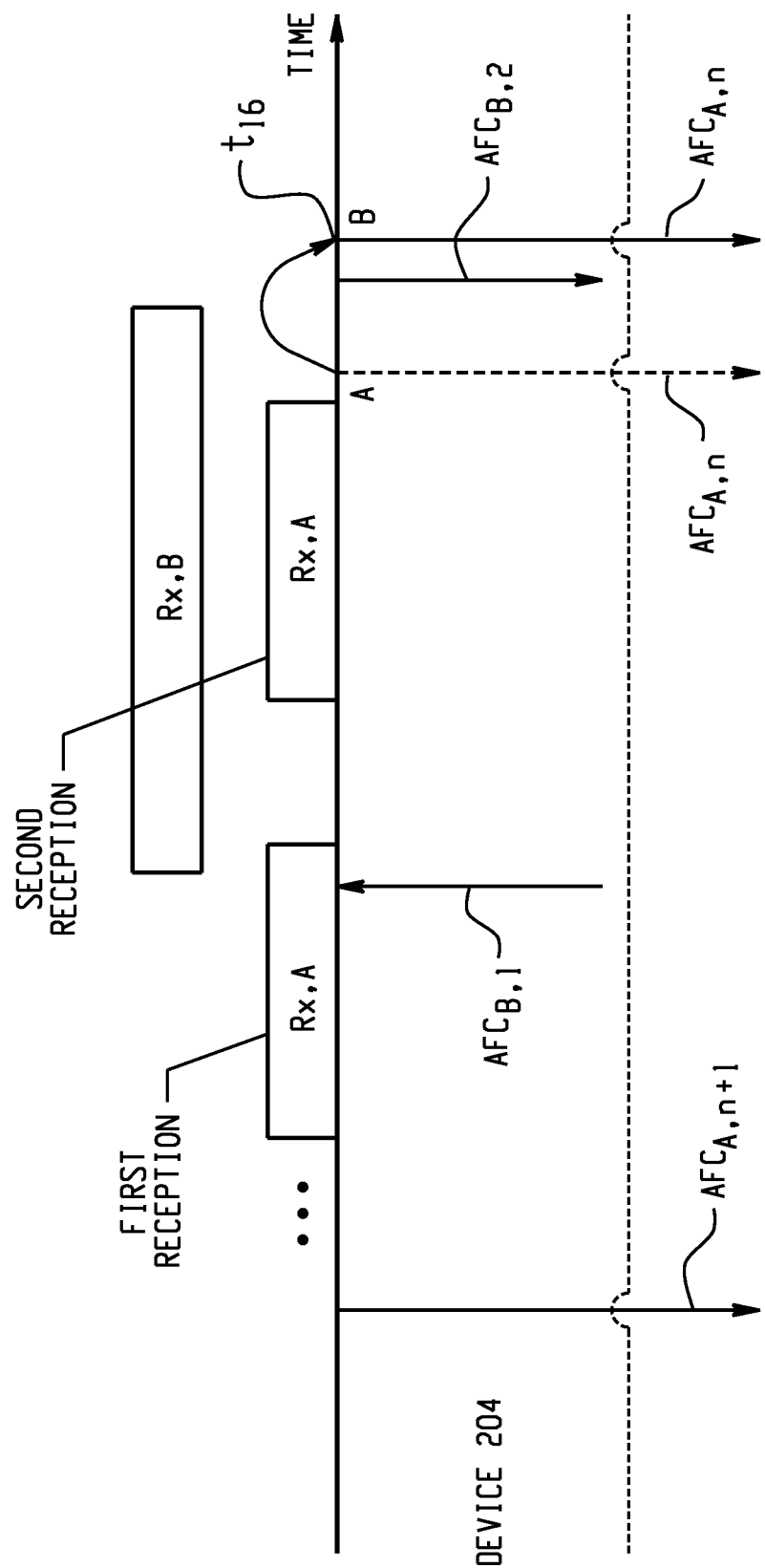

FIGS. 7-9 show timing diagrams illustrating example operations of the wireless communication system 200 for timing control of adjusting the reference clock signal 224. In operation, when the device 202 changes the reference clock signal 224 after a reception, it may take a period of time for the reference clock signal 224 to stabilize. If the device 204 communicates with the wireless network β before the reference clock signal 224 stabilizes, negative effects may be caused to the communication of the device 204. The wireless communication system 200 as shown in FIGS. 2-4 may further include one or more timing engines (e.g., in the baseband component 262 and/or the baseband component 266) to monitor the communication status of the device 202 and the device 204, so as to control the timing of changing the reference clock signal 224.

As shown in FIG. 7, the device 204 begins to receive signals from the wireless network β (e.g., $R_{x,B}$) during a continuous reception of the device 202 from the wireless network α (e.g., $R_{x,A}$), and the reception of the device 204 lasts longer than the reception of the device 202. The device 202 may delay the determination of frequency deviation and the adjustment of the reference clock signal 224 from time $t_{14}$ to time $t_{15}$, i.e., after the reception of the device 204. Similarly, as shown in FIG. 8, the device 202 delays the determination of frequency deviation and the adjustment of the reference clock signal 224 after a transmission of the device 204 (e.g., $T_{x,B}$).

As shown in FIG. 9, a continuous reception of the device 204 (e.g., $R_{x,B}$) overlaps two consecutive receptions of the device 202 (i.e., "first reception" and "second reception"). There is neither a determination of frequency deviation nor adjustment of the reference clock signal 224 after the first reception of the device 202. When the reception of the device 204 ends, the device 202 determines a frequency reception and adjusts the reference clock signal 224 (e.g., at time $t_{16}$).

This written description uses examples to disclose the invention, include the best mode, and also to enable a person skilled in the art to make and use the invention. The patentable scope of the invention may include other examples that occur to those skilled in the art.

For example, the systems and methods described herein may be implemented on many different types of processing systems by program code comprising program instructions that are executable by the system processing subsystem. Other implementations may also be used, however, such as firmware or appropriately designed hardware configured to carry out the methods and systems described herein. In another example, the systems and methods described herein may be implemented in an independent processing engine, as a co-processor, or as a hardware accelerator. In yet another example, the systems and methods described herein may be provided on many different types of computer-readable media including computer storage mechanisms (e.g., CD-ROM, diskette, RAM, flash memory, computer's hard drive, etc.) that contain instructions (e.g., software) for use in execution by a processor to perform the methods' operations and implement the systems described herein.

What is claimed is:

1. A mobile communication system comprising:
    a first communication device configured to
        generate a reference clock signal,
        receive a wireless first received signal,
        determine a first frequency deviation between the first received signal and the reference clock signal, and
        adjust the reference clock signal to reduce the first frequency deviation; and
    a second communication device configured to
        generate a frequency-indicative signal that (i) is indicative of a receiving frequency of the second communication device and (ii) is based on the reference clock signal such that adjustment of the reference clock signal by the first communication device would cause a corresponding adjustment to the second clock signal,
        receive a wireless second received signal,
        determine a second frequency deviation between the second received signal and the frequency-indicative signal, and
        adjust the frequency-indicative clock signal to reduce the second frequency deviation; and
    wherein the first communication device is further configured to, after the adjusting of the reference clock signal, start receiving a wireless third received signal,
        end receiving the third received signal during the receiving of the second received signal,
        after waiting until the receiving of the second received signal is completed, determine a third frequency deviation between the third received signal and the reference clock signal, and
        adjust the reference clock signal to reduce the third frequency deviation.

2. The system of claim 1, wherein the first communication device and the second communication device are included in a single cellular phone.

3. The system of claim 1, wherein the first communication device includes a phase-locked loop configured to generate the reference clock signal.

4. The system of claim 1, wherein the second communication device includes a phase-locked loop configured to generate the frequency-indicative signal based on the reference clock signal.

5. The system of claim 1, wherein the second communication device includes a register configured to store the determined second frequency deviation.

6. The system of claim 1, wherein the first communication device is configured to transmit a first transmitted signal on a frequency that is based on the reference clock signal, and wherein the second communication device is configured to transmit a second transmitted signal on a frequency that is based on the frequency-indicative signal.

7. The system of claim 1, further comprising:
    a third communication device configured to
        generate a second frequency-indicative signal that (i) is indicative of a receiving frequency of the third communication device and (ii) is based on the reference clock signal such that adjustment of the reference clock signal by the first communication device would cause a corresponding adjustment to the third clock signal,
        receive a wireless fourth received signal,
        determine a fourth frequency deviation between the fourth received signal and the second frequency-indicative signal, and
        adjust the second frequency-indicative signal to reduce the fourth frequency deviation; and
    wherein the first communication device is further configured to, after the adjusting of the reference clock signal, start receiving a wireless fifth received signal,
        end receiving the fifth received signal during the receiving of the fourth received signal,
        determine a fifth frequency deviation between the fifth received signal and the reference clock signal, and
        adjust, after waiting until the receiving of the fourth received signal is completed, the reference clock signal to reduce the fifth frequency deviation.

8. The system of claim 1, wherein the second communication device is configured to generate the frequency-indicative signal by:
    determining a prior frequency deviation between the reference clock signal and a frequency of a second network, and
    generating the frequency-indicative signal by adjusting the reference clock signal to reduce the prior frequency deviation.

9. The system of claim 1, wherein the first communication device is configured to delay the adjusting of the reference clock signal until after completion of the receiving of the second received signal even in a situation in which (i) the first received signal ends during receipt of the second received signal and (ii) the receiving of the third received signal both starts and ends during the receiving of the second received signal.

10. A method comprising:
    generating, by a first communication device, a reference clock signal;
    receiving, by the first communication device, a wireless first received signal;
    determining, by the first communication device, a first frequency deviation between the first received signal and the reference clock signal
    adjusting, by the first communication device, the reference clock signal to reduce the first frequency deviation;
    generating, by a second communication device, a frequency-indicative signal that (i) is indicative of a receiving frequency of the second communication device and (ii) is based on the reference clock signal such that adjustment of the reference clock signal by the first communication device would cause a corresponding adjustment to the second clock signal;
    receiving, by the second communication device, a wireless second received signal;
    determining, by the second communication device, a second frequency deviation between the second received signal and the frequency-indicative signal;
    adjusting, by the second communication device, the frequency-indicative signal to reduce the second frequency deviation; and
    after the adjusting of the reference clock signal, the first communication device
        starting receiving a wireless third received signal, ending the receiving of the third received signal during the receiving of the second received signal, after waiting until the receiving of the second received signal is completed, determining a third frequency deviation between the third received signal and the frequency-indicative signal, and adjusting the reference clock signal to reduce the third frequency deviation.

11. The method of claim 10, further comprising:

transmitting, by the first communication device, a first transmitted signal to a first network on a frequency that is based on the reference clock signal; and transmitting, by the second communication device, a second transmitted signal to a second network on a frequency that is based on the frequency-indicate signal.

12. The method of claim 10, further comprising:

receiving, by a third communication device, the reference clock signal;

generating, by the third communication device, a second frequency-indicative signal that (i) is indicative of a receiving frequency of the third communication device and (ii) is based on the reference clock signal such that adjustment of the reference clock signal by the first communication device would cause a corresponding adjustment to the second frequency-indicative signal;

receiving, by the third communication device, a wireless fourth received signal, determining, by the third communication device, a fourth frequency deviation between the second frequency-indicative signal and the fourth received signal;

adjusting, by the third communication device, the second frequency-indicative signal to reduce the fourth frequency deviation; and the first communication device, after the adjusting of the reference clock signal, starting receiving a wireless fifth received signal, ending the receiving of the fifth received signal during the receiving of the fourth received signal, determining a fifth frequency deviation between the fifth received signal and the reference clock signal, and adjusting, after waiting until the receiving of the fourth received signal is completed, the reference clock signal to reduce the fifth frequency deviation.

13. The method of claim 10, wherein the generating of the frequency-indicative signal by the second communication device includes:

determining a prior frequency deviation between the reference clock signal and a frequency of a network, and generating the frequency-indicative signal by applying an adjustment to the reference clock signal to reduce the prior frequency deviation.

14. The method of claim 10, further comprising:

the receiving of the third received signal ending during the receiving of the second received signal; and after the ending of the receiving of the first received signal, the first communication device receiving a subsequent received signal that both starts and ends during the receiving of the second received signal.

15. The method of claim 10, wherein the first communication device and the second communication device are included in a single cellular phone.

16. The method of claim 10, wherein the first communication device includes a phase-locked loop that generates the reference clock signal.

17. The method of claim 10, wherein the first communication device includes a digital-to-analog converter configured to change the reference clock signal to keep the first frequency deviation within a predetermined range.

18. The method of claim 10, wherein the second communication device includes a phase-locked loop generates the frequency-indicate signal based on the reference clock signal.

19. The method of claim 10, wherein the determining of the third frequency deviation is preceded by the first communication device waiting until the receiving of the second received signal is completed.

* * * * *